United States Patent [19]

Sparber

[11] 4,283,675

[45] Aug. 11, 1981

[54] IMPEDANCE/ADMITTANCE MEASURING CIRCUIT

[75] Inventor: Richard G. Sparber, Wheaton, Ill.

[73] Assignee: Bell Telephone Laboratories, Incorporated, Murray Hill, N.J.

[21] Appl. No.: 19,367

[22] Filed: Mar. 12, 1979

[51] Int. Cl.³ .................................................. G01R 27/26
[52] U.S. Cl. ........................... 324/57 R; 179/175.3 R; 324/57 Q
[58] Field of Search ........................ 324/57 R, 57 Q; 179/175, 175.3 R, 175.2 C, 18 FA, 175.2 R; 331/167, 172; 328/167

[56] References Cited

U.S. PATENT DOCUMENTS

| | | | |
|---|---|---|---|
| 3,283,242 | 11/1966 | Oliver | 324/57 R |
| 3,284,705 | 11/1966 | Dobson | 324/57 R |
| 3,612,993 | 10/1971 | Tims | 324/57 R |

OTHER PUBLICATIONS

Adams, T. M.; Oscillator Circuits; Howard W. Sams & Co., Inc.; Indianapolis, Ind.; 1961; pp. 53-61.

Graeme et al.; Burr Brown Operational Amplifiers... Pub. by McGraw-Hill Inc.; 1971; pp. 293-295.

Weber, S.; Circuits for Electronics Engineers; McGraw-Hill Pub. Co., New York, NY; 1977; pp. 278-280.

Primary Examiner—Ernest F. Karlsen
Attorney, Agent, or Firm—Peter Visserman

[57] ABSTRACT

An impedance/admittance measuring circuit generates an output signal which is representative of the real or imaginary part of the impedance or admittance of a connected load. An excitation signal comprising a square wave having a fixed magnitude is generated and applied to a load. The response signal resulting from the excitation signal is filtered by a two pole bandpass filter (106). The filter output signal is used to control the excitation signal generator (101, 102) such that an oscillatory feedback loop is formed. By controlling the load connection and the phase relations between the excitation signal and the filter output signal, the magnitude of the output signal is representative of the real or imaginary part of the impedance or admittance of the connected load (103).

11 Claims, 4 Drawing Figures

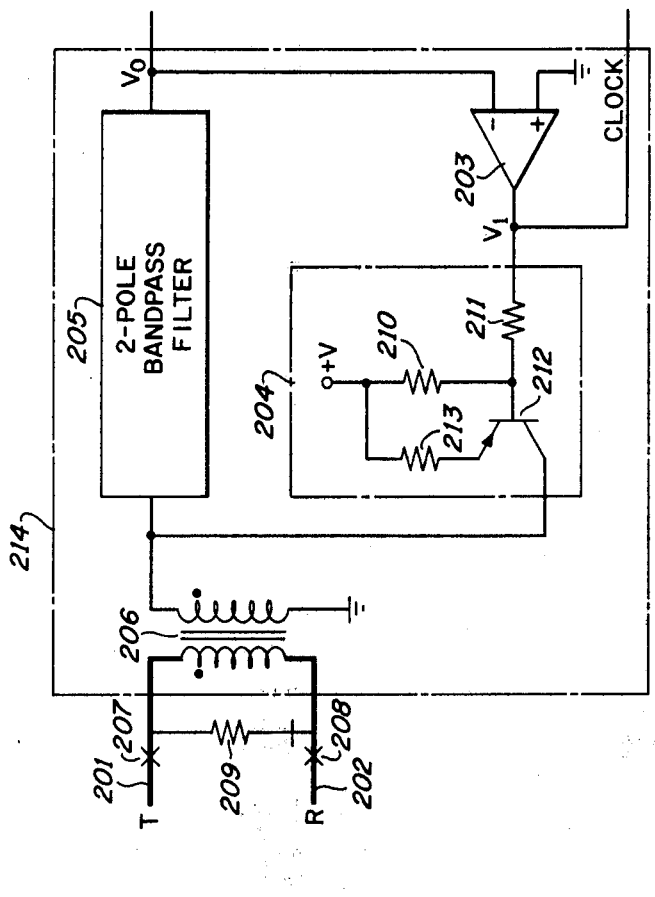
FIG. 2
FIG. 4
| FIG. 2 | FIG. 3 |
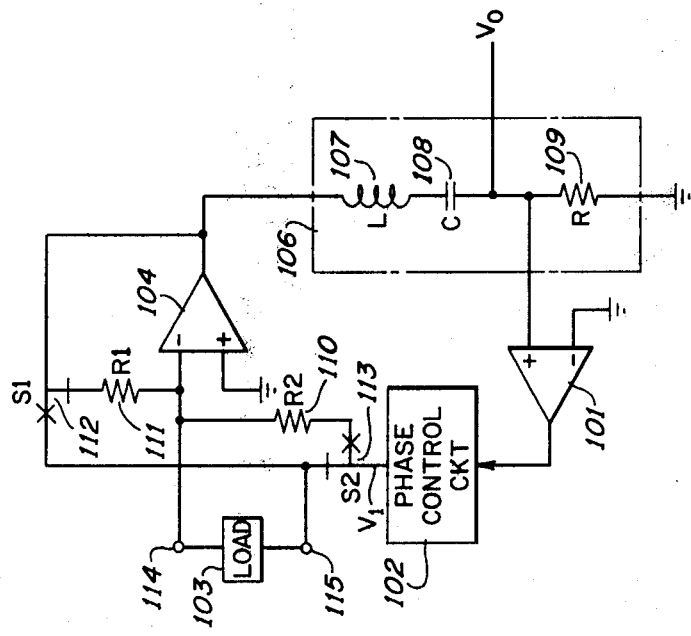
FIG. 1

IMPEDANCE/ADMITTANCE MEASURING CIRCUIT

CROSS-REFERENCE TO RELATED APPLICATIONS

This application is related to the application of J. L. Neigh et al., Ser. No. 019,368, filed Mar. 12, 1979, now U.S. Pat. No. 4,224,483, which was filed concurrently herewith and assigned to the assignee of the present application.

BACKGROUND OF THE INVENTION

This invention relates to circuits for measuring impedance and admittance and, more particularly, to a circuit for measuring the real and imaginary parts of both impedances and admittances.

The majority of prior art impedance measuring circuits utilize bridge-type networks. Such prior art arrangements measure an unknown impedance by utilizing a number of variable impedance elements to form three arms of a bridge with the fourth arm of the bridge comprising the unknown impedance. The variable impedance elements are adjusted until a null appears across the bridge, at which time the values of the ratios of the variable impedance elements determine the value of the unknown impedance.

One specific prior art arrangement disclosed in U.S. Pat. No. 3,284,705, issued to Dobson on Nov. 8, 1966, drives an unknown impedance with a fixed sinusoidal current signal. Two signals are derived from the driving current signal one in phase with the current signal, and the other having a $-90$ degree phase relation to the current signal. The two derived signals are used separately to gate the response voltage signal generated across the unknown impedance to two separate direct current microammeters which serve to integrate the gated signals. The signal gated by the derived inphase signal yields the real part of the unknown impedance while the signal gated by the derived phase shifted signal yields the imaginary part of the unknown impedance.

These prior art measuring circuits are bulky, expensive, and not in keeping with modern day technology. Furthermore, no known prior art measuring circuit has the capability of directly measuring the real and the imaginary parts of both the impedance and the admittance of a connected load.

SUMMARY OF THE INVENTION

A measuring circuit in accordance with my invention applies a fixed amplitude excitation signal to a load and the resulting response signal is passed through a two pole bandpass filter circuit. The output signal from the filter circuit is fed back to the excitation signal generator to form a positive feedback loop and to set the relative phase relationship between the filter output signal and the excitation signal. By selectively setting the phase of the excitation signal relative to the filter output signal, the filter output signal is proportional to the real part or the imaginary part of the impedance or admittance of a connected load.

In an illustrative embodiment, the filter output signal drives a comparator circuit connected to a phase control circuit to generate a fixed amplitude excitation signal having a set phase relative to the filter output signal. The excitation signal drives an unknown load which is selectively connected as either an input element or a feedback element of an operational amplifier whose output drives the filter circuit. A switch provides the selective connection of the load and connects a fixed resistor into the operational amplifier circuit position unoccupied by the load.

BRIEF DESCRIPTION OF THE DRAWING

The invention will be better understood from the following detailed description when read with reference to the drawing in which:

FIG. 1 is an illustrative schematic diagram of a measuring circuit for measuring the real and imaginary parts of impedances and admittances of a connected load;

FIG. 2 is an illustrative schematic diagram of an impedance measuring circuit which is used in a loop identification circuit and measures the positive real part of the impedance of a connected load;

FIG. 4 is a composite drawing indicating how FIGS. 2 and 3 are arranged to form a schematic diagram of an electronic loaded/nonloaded telephone loop identification circuit.

DETAILED DESCRIPTION

Figure 3:
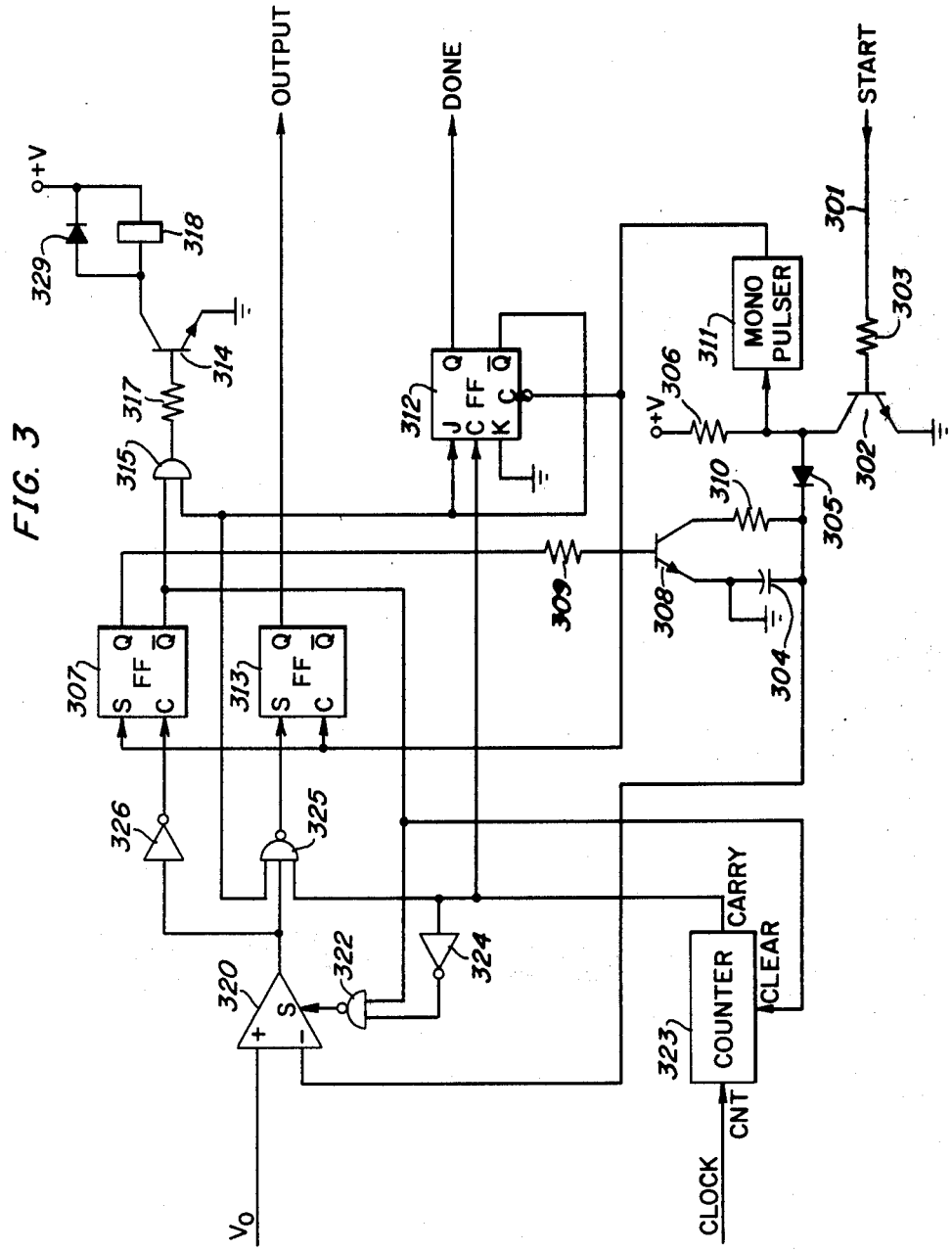
FIG. 3 is a schematic diagram of one embodiment of circuitry used to compare the output signal of the impedance measuring circuit of FIG. 2 to a reference signal and for generating the reference signal.

FIG. 1 is a schematic diagram of an illustrative embodiment of a novel impedance/admittance measuring circuit which can measure the real or imaginary parts of the complex impedance or the complex admittance of a connected load. The measuring circuit is a positive feedback oscillatory loop comprising the comparator 101, the phase control circuit 102, the load 103, the terminals 114 and 115 for connecting the load to the measuring circuit, the operational amplifier (OP amp) 104, the resistors 110 and 111, the switch contact sets 112 and 113 of a function selection switch, and the two pole bandpass filter 106 which comprises the inductor 107, the capacitor 108 and the resistor 109. The load 103 is selectively connected by the switch contacts 112 and 113 as the input element or the feedback element of the OP amp 104 for measuring admittances or impedances, respectively. The function selection switch contacts are represented as detached contacts. A cross or x on a conductor path represents make or normally open contacts through which a path is completed only when the switch is operated. A line perpendicularly drawn across a conductor path represents break or normally closed contacts through which a path is completed only when the switch is not operated. A combination of make and break contacts is referred to as transfer contacts which complete a path from a common contact to a make contact only when the switch is operated and complete a path from the common contact to a break contact only when the switch is not operated.

By setting the proper phase relation between the excitation signal $V_1$ and the output voltage $V_0$ via the phase control circuit 102, the measuring circuit oscillates and the magnitude of the output voltage $V_0$ is proportional to the real or imaginary part of the impedance if the function selection switch is operated or the admittance if the switch is not operated, of the connected load 103. A variety of phase control circuits are well known in the prior art as disclosed in *Circuits for Electronics Engineers* edited by Samuel Weber, and published by McGraw-Hill Incorporated in 1977, at page 278 et seq.

If the function selection switch comprising the contact sets 112 and 113 is operated and the load 103 is represented by an impedance $Z_1$, the output voltage $V_0$ is related to the excitation signal $V_1$ by the following general equation:

$$V_0 = \left[ -\frac{Z_1}{R_2} \right] \left[ \frac{R}{R + j\left(wL - \frac{1}{wc}\right)} \right] V_1$$

Solving for $Z_1$ yields:

$$Z_1 = \left[ R + j\left(wL - \frac{1}{wc}\right) \right] \left[ -\frac{R_2}{R} \right] \frac{V_0}{V_1}$$

The phase relation between the output voltage $V_0$ and the excitation signal $V_1$ determines whether the real part or the imaginary part of an admittance or impedance is measured and whether the real part or imaginary part which can be measured is positive or negative. For example, if a zero phase shift is introduced by the phase control circuit 102 such that the output voltage $V_0$ and the excitation signal $V_1$ are in phase, the equation for the impedance $Z_1$ becomes:

$$Z_1 = -\frac{R_2 V_0}{V_1} + j\frac{R_2 V_0}{R V_1}\left[\frac{1}{wc} - wL\right]$$

For this phase relation, the output voltage $V_0$ is proportional to the real part of the impedance connected as the load 103 for impedances having a negative real part. This is true regardless of the imaginary part of the impedance. However, if a connected load impedance has a positive real part, the circuit fails to oscillate and the output voltage $V_0$ goes to zero.

To measure the real part of an impedance having a positive real part, a 180 degree phase relation must be introduced between the output voltage $V_0$ and the excitation signal $V_1$. For a 180 degree phase relation between $V_0$ and $V_1$, $(V_0/V_1)$ will be equal to minus the magnitude of $(V_0/V_1)$ which leads to the following equation for the impedance $Z_1$:

$$Z_1 = R_2 \left|\frac{V_0}{V_1}\right| + j\frac{R_2}{R}\left[wL - \frac{1}{wc}\right] \left|\frac{V_0}{V_1}\right|$$

For a given value of $V_0$, the plot of the impedances which will produce that $V_0$ is a straight line parallel to the imaginary axis and crossing the real axis at a positive real part defined as $R_2$ times the magnitude of $(V_0/V_1)$. Accordingly, $V_0$ for this case is proportional to the positive real part of the connected load impedance.

By making the phase relation of the excitation signal $V_1$ to the output voltage $V_0$ +90 degrees or −90 degrees, the output voltage $V_0$ becomes proportional to the positive imaginary part or the negative imaginary part, respectively, of the impedance connected as the load 103. For a positive 90 degree phase relation, $(V_0/V_1)$ is equal to −j times the magnitude of $(V_0/V_1)$. The equation for the impedance $Z_1$ then becomes:

$$Z_1 = \frac{R_2}{R}\left|\frac{V_0}{V_1}\right|\left[\frac{1}{wc} - wL\right] + jR_2\left|\frac{V_0}{V_1}\right|$$

For a given value of $V_0$, the plot of the impedances which will produce that $V_0$ is a straight line parallel to the real axis and crossing the imaginary axis at a positive imaginary part defined as $R_2$ times the magnitude of $(V_0/V_1)$. Accordingly, $V_0$ for this case is proportional to the imaginary part of the impedance connected as the load 103.

For a negative 90 degree phase relation, $V_0$ is equal to j times the magnitude of $(V_0/V_1)$ and the equation for the impedance $Z_1$ becomes the following:

$$Z_1 = \frac{R_2}{R}\left|\frac{V_0}{V_1}\right|\left[wL - \frac{1}{wc}\right] - jR_2\left|\frac{V_0}{V_1}\right|$$

For a given value of $V_0$, the plot of the impedances which will produce that $V_0$ is a straight line parallel to the real axis and crossing the imaginary axis at a negative imaginary part defined as $-R_2$ times the magnitude of $(V_0/V_1)$. Accordingly, $V_0$ is proportional to the negative imaginary part of an impedance connected as the load 103.

If the real or imaginary parts of an admittance are to be measured, the function selection switch is set to admittance or placed in the not operated position. If the load is represented as $Z_2$, the equation for the admittance $Y_2$, which is the reciprocal of the impedance $Z_2$, is as follows:

$$Y_2 = \left[ R + j\left(wL - \frac{1}{wc}\right) \right] \left[ -\frac{1}{R_1 R} \frac{V_0}{V_1} \right]$$

For a zero phase relation between the output voltage $V_0$ and the excitation signal $V_1$, the equation for the admittance $Y_2$ becomes:

$$Y_2 = -\frac{1}{R_1}\left|\frac{V_0}{V_1}\right| + j\frac{1}{R_1 R}\left|\frac{V_0}{V_1}\right|\left[\frac{1}{wc} - wL\right]$$

For a given value of $V_0$, the plot of all admittances which will produce that $V_0$ is a straight line parallel to the imaginary axis and crossing the real axis at a negative real part defined as $-1$ times the magnitude of $(V_0/V_1)$ divided by $R_1$. Accordingly, $V_0$ is proportional to the negative real part of an admittance connected as the load 103.

If a phase relation of 180 degrees is imposed between the output voltage $V_0$ and the excitation signal $V_1$, $V_0$ will be proportional to the positive real part of the admittance $Y_2$. An analysis similar to that performed above for an impedance measurement shows that a phase relation of +90 degrees and −90 degrees between the excitation signal $V_1$ and the output voltage $V_0$ will allow the measurement of a positive imaginary part of an admittance and a negative imaginary part of an admittance, respectively.

FIG. 2 is a schematic diagram of the impedance measuring circuit 214 for measuring the real part of the impedance of a connected load. The impedance measuring circuit 214 comprises the comparator 203, the current source 204, the transformer 206, and the two pole bandpass filter 205. The relay make contacts 207 and the relay transfer contacts 208 selectively connect either the reference resistor 209 or a customer loop which is connected to the tip and ring terminals 201 and 202.

A fixed amplitude square wave excitation signal generated by the current generator 204 is coupled to a connected load via the transformer 206. The signal resulting from applying the excitation signal to the connected load is filtered by the two pole bandpass filter 205 resulting in the nearly sinusoidal output voltage $V_0$ which has a magnitude proportional to the positive real part of the impedance of the connected load. The output voltage $V_0$ controls the comparator 203 to form an oscillatory positive feedback loop for loads having a positive real part. The comparator 203 in response to the output voltage $V_0$ generates a fixed amplitude square wave signal which controls the current source 204 and serves as a clock signal for the circuitry shown in FIG. 3 as will be described hereinafter.

The impedance measuring circuit 214 of FIG. 2 is an embodiment of the generalized impedance/admittance measuring circuit of FIG. 1 which is set up to measure the positive real part of the impedance of the load 103. The correlation between the measuring circuits of FIG. 1 and FIG. 2 is most easily observed by noting that the OP amp 104 and the resistor 110 form a current source which drives the load 103 if the function selection switch is operated. Further, the negative input terminal of the OP amp 104 is at virtual ground such that one side of the load to be measured is effectively at ground potential in both circuits. Finally, the phase shifts around the feedback loop of the impedance measuring circuit 214 correspond to those of the circuit of FIG. 1 if the circuit of FIG. 1 is set up to measure the positive real part of the impedance of the load 103. A mathematical analysis similar to that previously performed relative to FIG. 1 shows that the magnitude of the output voltage $V_0$ of the impedance measuring circuit 214 is proportional to the positive real part of the impedance of a connected load.

The output of the comparator 203 is a square wave having a positive amplitude approximately equal to the positive supply voltage of the comparator 203 and a negative amplitude approximately equal to the negative supply voltage of the comparator 203. The resistors 210 and 211 form a voltage divider to set the voltage level at the base terminal of the transistor 212. If the output signal of the comparator 203 is high, the transistor 212 is turned off. If the output signal of the comparator 203 is low, the transistor 212 is turned on and the current flow from the collector terminal is equal to the supply voltage $+V$ minus the emitter-base voltage drop of the transistor 212, minus the base voltage of the transistor 212, divided by the resistance value of the resistor 213, and multiplied by the $\alpha$ of the transistor 212.

A two pole active filter which can be utilized in the impedance measuring circuit of FIG. 2 is fully described in *Burr Brown Operational Amplifiers Design and Applications* edited by Tobey, Graeme, and Huelsman, and published by McGraw-Hill Incorporated in 1971, at page 293 et seq.

FIG. 3 is a schematic diagram of an illustrative embodiment of circuitry for utilizing the impedance measuring circuit of FIG. 2 to identify loaded loops and nonloaded loops. For this application, a loaded loop is defined as a telephone customer 2-wire metallic loop into which lumped inductive loads have been connected to reduce the effects of distributed loop capacitance in accordance with well-known telephone loop design practices. Prior to a loop identification operation, the signal on the start lead 301 is low which maintains the transistor 302 in its off state via the current limiting resistor 303. While the transistor 302 is in its off state, the capacitor 304 is charged through the diode 305 and the resistor 306 to approximately the supply voltage $+V$. The flip-flop 307 is in its clear state which maintains the transistor 308 in its off state via the current limiting resistor 309 so that the capacitor 304 is not discharging via the resistor 310 and the transistor 308.

The signal on the start lead 301 goes high to signal the start of a loop identification operation. A high signal on the start lead 301 places the transistor 302 into its on state which clamps the anode of the diode 305 to approximately ground potential to stop the charging of the capacitor 304 through the resistor 306 and the diode 305. The turn on of the transistor 302 also triggers the monostable multivibrator or monopulser 311 which provides a short ground potential synchronizing pulse to clear the flip-flop 312 and the flip-flop 313 and to set the flip-flop 307.

Setting the flip-flop 307 places the transistor 308 into its on state which starts to discharge the capacitor 304 through the resistor 310 and the transistor 308. The Q output signal from the flip-flop 307 is low so that the transistor 314 is in an off state via the AND gate 315 and the current limiting resistor 317. Accordingly, the relay coil 318 is de-energized. The relay contacts 207 and 208 shown in FIG. 2 are controlled by the relay coil 318. With the relay coil 318 de-energized, the reference resistor 209 is connected to the impedance measuring circuit via the relay contacts 208.

The impedance measuring circuit 214 of FIG. 2 provides an output voltage $V_0$ having a magnitude which is proportional to the real part of the connected impedance, in this case, proportional to the resistance value, 463 ohms for the loop identification circuit, of the reference resistor 209. The sinusoidal voltage $V_0$ is compared to the voltage on the capacitor 304 by the comparator 320. A high signal is applied to the strobe input S of the comparator 320 to enable the output signal of the comparator 320. The high signal on the strobe input S of the comparator 320 is provided by the low signal on the Q output of the flip-flop 307 and the NAND gate 322.

The low signal on the Q output of the flip-flop 307 and the low signal from the counter circuit 323 force the output signals of the NAND gates 322 and 325 and the inverter 324 to be high. The voltage on the capacitor 304 is initially greater than the peak magnitude of the $V_0$ signal. Accordingly, the output signal of the comparator 320 is low and the output of the inverter 326 is high. Due to the discharge through the resistor 310 and the transistor 308, the voltage on the capacitor 304 decreases gradually relative to the period of oscillation of the impedance measuring circuit 214, which is approximately 3200 hz for the loop identification circuit. Eventually the voltage on the capacitor 304 crosses at or near a peak of the $V_0$ signal and the output signal of the comparator 320 goes high. A high output signal from the comparator 320 forces the output signal of the inverter 326 to go low which clears the flip-flop 307. A high signal on the Q output of the flip-flop 307 clamps the output signal of the comparator 320 low via the NAND gate 322 and energizes the relay coil 318 through the AND gate 315, the current limiting resistor 317 and the transistor 314.

Energizing the relay coil 318 operates the relay contacts 207 and 208 shown in FIG. 2 to connect the unknown loop impedance connected to the terminals 201 and 202 to the impedance measuring circuit 214 of FIG. 2 and to disconnect the reference resistor 209 therefrom. Clearing the flip-flop 307 also removes the hard clear on the binary counter 323 and it begins to count clock pulses generated by the impedance measuring circuit of FIG. 2. The low signal on the Q output of the flip-flop 307 turns off the transistor 308 to stop the discharge of the capacitor 304 so that the voltage on the capacitor 304 is representative of the real part of the reference resistor 209 which was connected across the impedance measuring circuit 214, i.e., the reference resistor 209 itself. After counting 64 clock pulses, the carry output signal on the counter 323 goes high to unclamp the output of the comparator 320 through the inverter 324 and the NAND gate 322. The counter 323 counting to 64 provides a time period during which the transient signals associated with switching the loads connected to the impedance measuring circuit can settle down. After this delay period, the output voltage $V_0$ of the impedance measuring circuit can be reliably compared to the reference voltage on the capacitor 304. Strobing the output signal from the comparator 320 with the carry output signal from the counter circuit 323 also serves to reduce the noise susceptibility of the loop identification circuit.

If the peak value of the output voltage $V_0$ is less than the reference voltage on the capacitor 304, the output signal of the comparator 320 is low and the flip-flop 313 remains in its cleared state so that its Q output signal is low. If the peak value of the output voltage $V_0$ is greater than the reference voltage on the capacitor 304, the output signal of the comparator 320 is high during the portion of the $V_0$ waveform which exceeds the reference voltage and the flip-flop 313 is set so that its Q output signal is high. The next clock pulse counted by the counter circuit 323 causes the output signal of the counter circuit 323 to go low which clocks the flip-flop 312 and places it into its set state so that its Q output signal is high indicating that the comparison is complete and that the result is indicated by the signal on the Q output of the flip-flop 313. When the start signal again goes low, the transistor 302 is turned off so that the capacitor 304 can again charge to approximately the supply voltage $+V$. The diode 329 serves to suppress high voltage noise spikes which are generated when the current flow through the relay coil 318 is abruptly halted.

It is to be understood that the above described embodiment is merely illustrative of the principles of the invention and that other arrangements may be devised by those skilled in the art without departing from the spirit and scope of the invention.

What is claimed is:

1. A circuit arrangement for measuring the electrical characteristics of a connected load comprising:
   generator means for generating an excitation signal having a fixed amplitude and for applying said excitation signal to said load;
   filter means connected to said generator means and responsive to signals received from said load for generating a filtered response signal; and
   isolating coupler means for coupling said signals from said load to said filter means and for isolating said load from the loading effects of said filter means;
   said generator means being responsive to said filtered response signal to generate said excitation signal.

2. The arrangement in accordance with claim 1 characterized in that said filter means comprises a two pole bandpass filter.

3. The arrangement in accordance with claim 1 characterized in that said generator means comprises a comparator circuit (101) for comparing said filtered response signal to a fixed potential to generate a control signal.

4. The arrangement in accordance with claim 3 characterized in that said generator means further comprises phase control means (102) for selectively setting the phase relation between said excitation signal and said filtered response signal and said phase control means is responsive to said control signal for generating said excitation signal.

5. A circuit arrangement comprising
   generator means (101, 102) for generating an excitation signal and for applying said excitation signal to a connected load (103), and
   filter means (106) responsive to signals received from said load and connected to said load for generating a filtered response signal;
   characterized in that
   said generator means is responsive to said filtered response signal to generate said excitation signal at a defined phase relative to said filtered response signal and said arrangement further comprises:
   amplifier means (104) having an output terminal connected to said filter means and an input terminal, and
   switching means (112, 113) for selectively connecting said load as a feedback element connected between said input terminal and said output terminal, and as an input element connected between said generator means and said input terminal.

6. The arrangement in accordance with claim 1 characterized in that said coupler means comprises:
   amplifier means (104) having an output terminal connected to said filter means and an input terminal; and
   switching means (112, 113) for selectively connecting said load as a feedback element connected between said input terminal and said output terminal, and as an input element connected between said generator means and said input terminal.

7. The arrangement in accordance with claim 6 or 5 characterized in that said coupler means further comprises a first resistor (111) and a second resistor (110) and said switching means further comprises means (112, 113) for connecting said first resistor as a feedback element connected between said input terminal and said output terminal and for connecting said second resistor as an input element connected between said generator means and said input terminal.

8. The arrangement in accordance with claim 1 characterized in that said coupler means comprises:
   amplifier means (104) having an output terminal connected to said filter means and an input terminal;
   switching means (112, 113) comprising a first set of transfer contacts and a second set of transfer contacts each contact set comprising a make contact, a common contact, and a break contact, the common contact of said first set being connected to the output terminal of said amplifier means, the common contact of said second set being connected to said generator means, and the make contact of said first set being connected to the break contact of said second set;

a first resistor (111) connected between the input terminal of said amplifier means and the break contact of said first set of transfer contacts;

a second resistor (110) connected between the input terminal of said amplifier means and the make contact of said second set of transfer contacts;

a first load connection terminal (114) connected to the input terminal of said amplifier means; and a second load connection terminal (115) connected to the break contact of said second set of transfer contacts.

9. The arrangement in accordance with claim 1 characterized in that said coupler means comprises amplifier means (104) for isolating said load from loading effects of said filter means.

10. The arrangement in accordance with claim 1 characterized in that said coupler means comprises switching means (112, 113) for selectively connecting said load to said generator means and said filter means.

11. A circuit arrangement comprising generator means (101, 102) for generating an excitation signal and for applying said excitation signal to a connected load (103), and filter means (106) responsive to signals received from said load and connected to said load for generating a filtered response signal;

characterized in that said generator means is responsive to said filtered response signal to generate said excitation signal at a defined phase relative to said filtered response signal and said arrangement further comprises:

amplifier means (104) having an output terminal connected to said filter means and an input terminal;

switching means (112, 113) comprising a first set of transfer contacts and a second set of transfer contacts, each contact set comprising a make contact, a common contact, and a break contact, the common contact of said first set being connected to the output terminal of said amplifier means, the common contact of said second set being connected to said generator means, and the make contact of said first set being connected to the break contact of said second set;

a first resistor (111) connected between the input terminal of said amplifier means and the break contact of said first set of transfer contacts;

a second resistor (110) connected between the input terminal of said amplifier means and the make contact of said second set of transfer contacts;

a first load connection terminal (114) connected to the input terminal of said amplifier means; and a second load connection terminal (115) connected to the break contact of said second set of transfer contacts.

* * * * *

UNITED STATES PATENT AND TRADEMARK OFFICE
CERTIFICATE OF CORRECTION

PATENT NO. : 4,283,675
DATED : August 11, 1981
INVENTOR(S) : Richard G. Sparber

It is certified that error appears in the above-identified patent and that said Letters Patent is hereby corrected as shown below:

Column 6, line 27, "Q" should read -- $\overline{Q}$ --.

Column 6, line 47, "Q" should read -- $\overline{Q}$ --.

Column 6, line 49, "Q" should read -- $\overline{Q}$ --.

Column 6, line 66, "Q" should read -- $\overline{Q}$ --.

Signed and Sealed this

Eighth Day of November 1983

[SEAL]

Attest:

GERALD J. MOSSINGHOFF

Attesting Officer     Commissioner of Patents and Trademarks